(12) United States Patent
Zhao et al.

(10) Patent No.: US 10,948,535 B2
(45) Date of Patent: Mar. 16, 2021

(54) DISPLAY DEVICE AND DETECTION METHOD FOR THE DISPLAY DEVICE

(71) Applicant: BOE TECHNOLOGY GROUP CO., LTD., Beijing (CN)

(72) Inventors: Detao Zhao, Beijing (CN); Liang Chen, Beijing (CN); Li Xiao, Beijing (CN); Dongni Liu, Beijing (CN); Lei Wang, Beijing (CN); Minghua Xuan, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/391,833

(22) Filed: Apr. 23, 2019

(65) Prior Publication Data

US 2020/0025820 A1    Jan. 23, 2020

(30) Foreign Application Priority Data

Jul. 20, 2018   (CN) .......................... 201810801287.6

(51) Int. Cl.
| | |
|---|---|
| *G01R 31/3187* | (2006.01) |
| *G01R 31/28* | (2006.01) |
| *G09G 3/20* | (2006.01) |
| *G09G 3/3225* | (2016.01) |
| *H01L 27/32* | (2006.01) |

(52) U.S. Cl.
CPC ....... *G01R 31/2825* (2013.01); *G09G 3/2003* (2013.01); *G09G 3/3225* (2013.01); *H01L 27/3211* (2013.01); *H01L 27/3276* (2013.01); *G09G 2300/0426* (2013.01); *G09G 2330/12* (2013.01)

(58) Field of Classification Search
CPC .............. G01R 31/2825; G01R 31/041; G01R 31/2863; G01R 27/02
See application file for complete search history.

(56) References Cited

U.S. PATENT DOCUMENTS

| | | | |
|---|---|---|---|
| 2012/0161805 A1* | 6/2012 | Jung | .................... G09G 3/3648 324/754.07 |
| 2016/0225312 A1* | 8/2016 | Byun | ..................... G09G 3/006 |
| 2017/0270842 A1 | 9/2017 | Nam et al. | |
| 2018/0033368 A1* | 2/2018 | Chaji | .................. G09G 3/3291 |
| 2018/0053466 A1 | 2/2018 | Zhang et al. | |
| 2018/0053792 A1* | 2/2018 | Shin | .................... H01L 27/1244 |
| 2018/0182274 A1* | 6/2018 | Jung | ....................... G09G 3/20 |

(Continued)

FOREIGN PATENT DOCUMENTS

CN          107195249 A        9/2017

*Primary Examiner* — Thang X Le
(74) *Attorney, Agent, or Firm* — The Webb Law Firm

(57) ABSTRACT

The present disclosure provides a display device and a detection method for the display device. The display device includes a display area and a non-display area. The display device comprises: a pixel array at the display area, a plurality of switching transistors at the non-display area, and at least one detection line at the non-display area. The pixel array includes a plurality of sub-pixels. The plurality of switching transistors are electrically connected to a plurality of columns of sub-pixels of the pixel array in one-to-one correspondence. Each of the at least one detection line is electrically connected to a part of the plurality of switching transistors.

10 Claims, 4 Drawing Sheets

(56) References Cited

U.S. PATENT DOCUMENTS

| | | | |
|---|---|---|---|
| 2019/0180663 A1* | 6/2019 | Lee | G09G 3/006 |
| 2020/0111862 A1* | 4/2020 | Park | H01L 51/5256 |
| 2020/0135595 A1* | 4/2020 | Kim | H01L 22/12 |

* cited by examiner

DISPLAY DEVICE AND DETECTION METHOD FOR THE DISPLAY DEVICE

CROSS-REFERENCE TO RELATED APPLICATIONS

The present application is based on and claims priority to China Patent Application No. 201810801287.6 filed on Jul. 20, 2018, the disclosure of which is incorporated by reference herein in its entirety.

TECHNICAL FIELD

The present disclosure relates to a display device and a detection method for the display device.

BACKGROUND

At present, the successful mass production of the flexible screen such as an OLED (Organic Light Emitting Diode) screen is favorable for the manufacture of a new generation of high-end smartphones. Moreover, due to low power consumption and flexible properties of the flexible screen, its successful mass production also has a relatively significant impact on the application of wearable devices. In the future, the flexible screen will be widely applied with the continuous development of personal smart terminals. The OLED which is thin may be mounted on a flexible material structure such as plastic or metal foil. With the thin film encapsulation technology, a protective film is adhered to the back of a panel to make the panel become bendable.

SUMMARY

According to one aspect of embodiments of the present disclosure, a display device is provided. The display device comprises a display area and a non-display area, wherein the display device comprises: a pixel array at the display area that comprises a plurality of sub-pixels; a plurality of switching transistors at the non-display area, which are electrically connected to a plurality of columns of sub-pixels of the pixel array in one-to-one correspondence; and at least one detection line at the non-display area, wherein each of the at least one detection line is electrically connected to a part of the plurality of switching transistors, and is configured to transmit a level signal to a switching transistor electrically connected to the each of the at least one detection line such that sub-pixels of the pixel array electrically connected to the switching transistor do not emit light, and wherein the sub-pixels of the pixel array electrically connected to the switching transistor emit light to display a bright line having a corresponding color in a case where the each of the at least one detection line is broken.

In some embodiments, the non-display area comprises at least one subarea; each of the at least one detection line comprises a curved portion at one of the at least one subarea.

In some embodiments, the plurality of switching transistors comprises: a plurality of first switching transistors corresponding to red sub-pixels, a plurality of second switching transistors corresponding to green sub-pixels, and a plurality of third switching transistors corresponding to blue sub-pixels; and the at least one detection line comprises: a first detection line electrically connected to a part of the plurality of first switching transistors; a second detection line electrically connected to a part of the plurality of second switching transistors; and a third detection line is electrically connected to a part of the plurality of third switching transistors.

In some embodiments, the first detection line is electrically connected to a first electrode of the part of the plurality of first switching transistors, a second electrode of the part of the plurality of first switching transistors is electrically connected to red sub-pixels in a corresponding column of the pixel array, and a control electrode of the part of the plurality of first switching transistors is electrically connected to a switching signal line; the second detection line is electrically connected to a first electrode of the part of the plurality of second switching transistors, a second electrode of the part of the plurality of second switching transistors is electrically connected to green sub-pixels in a corresponding column of the pixel array, and a control electrode of the part of the plurality of second switching transistors is electrically connected to the switching signal line; and the third detection line is electrically connected to a first electrode of the part of the plurality of third switching transistors, a second electrode of the part of the plurality of third switching transistors is electrically connected to blue sub-pixels in a corresponding column of the pixel array, and a control electrode of the part of the plurality of third switching transistors is electrically connected to the switching signal line.

In some embodiments, the at least one subarea comprises a first subarea, a second subarea, and a third subarea; a curved portion of the first detection line is at the first subarea, a curved portion of the second detection line is at the second subarea, and a curved portion of the third detection line is at the third subarea.

In some embodiments, each of the at least one detection line is electrically connected to a part of the plurality of switching transistors, wherein sub-pixels corresponding to all of the switching transistors electrically connected to the at least one detection line have a same emission color.

In some embodiments, the plurality of switching transistors comprises a plurality of first switching transistors corresponding to red sub-pixels, a plurality of second switching transistors corresponding to green sub-pixels, and a plurality of third switching transistors corresponding to blue sub-pixels; the at least one detection line comprises a first detection line, a second detection line, and a third detection line, wherein the first detection line, the second detection line, and the third detection line are electrically connected to different first switching transistors respectively; the first detection line, the second detection line, and the third detection line are electrically connected to different second switching transistors respectively; or the first detection line, the second detection line, and the third detection line are electrically connected to different third switching transistors respectively.

In some embodiments, the at least one subarea comprises a first subarea, a second subarea, and a third subarea; a curved portion of the first detection line is at the first subarea, a curved portion of the second detection line is at the second subarea, and a curved portion of the third detection line is at the third subarea.

In some embodiments, the display device further comprises a power supply voltage line at the non-display area, wherein the power supply voltage line is electrically connected to the at least one detection line, and configured to provide the level signal which is a power supply level signal.

In some embodiments, a part of the at least one detection line is on one side of the display area, and another part of the at least one detection line is on another side of the display area opposite to the one side.

According to another aspect of embodiments of the present disclosure, a detection method for a display device is provided. The display device comprises a display area and a non-display area, wherein the display device comprises: a pixel array at the display area that comprises a plurality of sub-pixels; a plurality of switching transistors at the non-display area, which are electrically connected to a plurality of columns of sub-pixels of the pixel array in one-to-one correspondence; and at least one detection line at the non-display area, wherein each of the at least one detection line is electrically connected to a part of the plurality of switching transistors, and is configured to transmit a level signal to a switching transistor electrically connected to the each of the at least one detection line such that sub-pixels of the pixel array electrically connected to the switching transistor do not emit light, and wherein the sub-pixels of the pixel array electrically connected to the switching transistor emit light to display a bright line having a corresponding color in a case where the each of the at least one detection line is broken. The detection method comprises: applying an ON signal to the plurality of switching transistors; receiving the level signal by the at least one detection line; and determining whether a crack is present in the non-display area according to a characteristic information of the bright line appearing in a display screen of the display area.

In some embodiments, the detection method further comprises: determining a position of the crack in the non-display area according to a color of the bright line appearing in the display screen.

In some embodiments, the detection method further comprises: determining a position of the crack in the non-display area according to a position of the bright line appearing in the display screen.

In some embodiments, the plurality of switching transistors comprises: a plurality of first switching transistors corresponding to red sub-pixels, a plurality of second switching transistors corresponding to green sub-pixels, and a plurality of third switching transistors corresponding to blue sub-pixels; the at least one detection line comprises: a first detection line electrically connected to a part of the plurality of first switching transistors, a second detection line electrically connected to a part of the plurality of second switching transistors, and a third detection line is electrically connected to a part of the plurality of third switching transistors; each of the at least one detection line comprises a curved portion; and the non-display area comprises a first subarea, a second subarea, and a third subarea, wherein a curved portion of the first detection line is at the first subarea, a curved portion of the second detection line is at the second subarea, and a curved portion of the third detection line is at the third subarea. The step of determining a position of the crack according to a color of the bright line comprises: determining that a crack is present in the first subarea in a case where a red bright line appears in a white screen; determining that a crack is present in the second subarea in a case where a green bright line appears in the white screen; determining that a crack is present in the third subarea in a case where a blue bright line appears in the white screen; determining that a crack is present in each of the first subarea and the second subarea or a crack is present in an area at which the first detection line and the second detection line are both located in a case where a yellow bright line appears in the white screen; determining that a crack is present in each of the second subarea and the third subarea or a crack is present in an area at which the second detection line and the third detection line are both located in a case where a cyan bright line appears in the white screen; determining that a crack is present in each of the first subarea and the third subarea or a crack is present in an area at which the first detection line and the third detection line are both located in a case where a magenta bright line appears in the white screen; determining that a crack is present in each of the first subarea, the second subarea and the third subarea or a crack is present in an area at which the first detection line, the second detection line and the third detection line are all located in a case where a white bright line appears in a black screen;

In some embodiments, the plurality of switching transistors comprises: a plurality of first switching transistors corresponding to red sub-pixels, a plurality of second switching transistors corresponding to green sub-pixels, and a plurality of third switching transistors corresponding to blue sub-pixels; the at least one detection line comprises: a first detection line, a second detection line, and a third detection line, wherein the first detection line, the second detection line, and the third detection line are electrically connected to different first switching transistors respectively; each of the at least one detection line comprises a curved portion; and the non-display area comprises a first subarea, a second subarea, and a third subarea, wherein a curved portion of the first detection line is at the first subarea, a curved portion of the second detection line is at the second subarea, and a curved portion of the third detection line is at the third subarea. The step of determining a position of the crack according to a position of the bright line comprises: determining that a crack is present in the first subarea in a case where a first red bright line corresponding to the first detection line appears in a black screen; determining that a crack is present in the second subarea in a case where a second red bright line corresponding to the second detection line appears in the black screen; determining that a crack is present in the third subarea in a case where a third red bright line corresponding to the third detection line appears in the black screen; determining that a crack is present in each of the first subarea and the second subarea or a crack is present in an area at which the first detection line and the second detection line are both located in a case where the first red bright line and the second red bright line appear in the black screen; determining that a crack is present in each of the first subarea and the third subarea or a crack is present in an area at which the first detection line and the third detection line are both located in a case where the first red bright line and the third red bright line appear in the black screen; determining that a crack is present in each of the second subarea and the third subarea or a crack is present in an area at which the second detection line and the third detection line are both located in a case where the second red bright line and the third red bright line appear in the black screen; determining that a crack is present in each of the first subarea, the second subarea and the third subarea or a crack is present in an area at which the first detection line, the second detection line and the third detection line are all located in a case where the first red bright line, the second red bright line and the third red bright line appear in the black screen.

In some embodiments, the plurality of switching transistors comprises: a plurality of first switching transistors corresponding to red sub-pixels, a plurality of second switching transistors corresponding to green sub-pixels, and a plurality of third switching transistors corresponding to blue sub-pixels; the at least one detection line comprises: a first detection line, a second detection line, and a third detection line, wherein the first detection line, the second detection line, and the third detection line are electrically connected to different second switching transistors respectively; each of the at least one detection line comprises a curved portion; and the non-display area comprises a first subarea, a second subarea, and a third subarea, wherein a curved portion of the first detection line is at the first subarea, a curved portion of the second detection line is at the second subarea, and a curved portion of the third detection line is at the third subarea. The step of determining a position of the crack according to a position of the bright line comprises: determining that a crack is present in the first subarea in a case where a first green bright line corresponding to the first detection line appears in a black screen; determining that a crack is present in the second subarea in a case where a second green bright line corresponding to the second detection line appears in the black screen; determining that a crack is present in the third subarea in a case where a third green bright line corresponding to the third detection line appears in the black screen; determining that a crack is present in each of the first subarea and the second subarea or a crack is present in an area at which the first detection line and the second detection line are both located in a case where the first green bright line and the second green bright line appear in the black screen; determining that a crack is present in each of the first subarea and the third subarea or a crack is present in an area at which the first detection line and the third detection line are both located in a case where the first green bright line and the third green bright line appear in the black screen; determining that a crack is present in each of the second subarea and the third subarea or a crack is present in an area at which the second detection line and the third detection line are both located in a case where the second green bright line and the third green bright line appear in the black screen; determining that a crack is present in each of the first subarea, the second subarea and the third subarea or a crack is present in an area at which the first detection line, the second detection line and the third detection line are all located in a case where the first green bright line, the second green bright line and the third green bright line appear in the black screen.

In some embodiments, the plurality of switching transistors comprises: a plurality of first switching transistors corresponding to red sub-pixels, a plurality of second switching transistors corresponding to green sub-pixels, and a plurality of third switching transistors corresponding to blue sub-pixels; the at least one detection line comprises: a first detection line, a second detection line, and a third detection line, wherein the first detection line, the second detection line, and the third detection line are electrically connected to different third switching transistors respectively; each of the at least one detection line comprises a curved portion; and the non-display area comprises a first subarea, a second subarea, and a third subarea, wherein a curved portion of the first detection line is at the first subarea, a curved portion of the second detection line is at the second subarea, and a curved portion of the third detection line is at the third subarea. The step of determining a position of the crack according to a position of the bright line comprises: determining that a crack is present in the first subarea in a case where a first blue bright line corresponding to the first detection line appears in a black screen; determining that a crack is present in the second subarea in a case where a second blue bright line corresponding to the second detection line appears in the black screen; determining that a crack is present in the third subarea in a case where a third blue bright line corresponding to the third detection line appears in the black screen; determining that a crack is present in each of the first subarea and the second subarea or a crack is present in an area at which the first detection line and the second detection line are both located in a case where the first blue bright line and the second blue bright line appear in the black screen; determining that a crack is present in each of the first subarea and the third subarea or a crack is present in an area at which the first detection line and the third detection line are both located in a case where the first blue bright line and the third blue bright line appear in the black screen; determining that a crack is present in each of the second subarea and the third subarea or a crack is present in an area at which the second detection line and the third detection line are both located in a case where the second blue bright line and the third blue bright line appear in the black screen; determining that a crack is present in each of the first subarea, the second subarea and the third subarea or a crack is present in an area at which the first detection line, the second detection line and the third detection line are all located in a case where the first blue bright line, the second blue bright line and the third blue bright line appear in the black screen.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
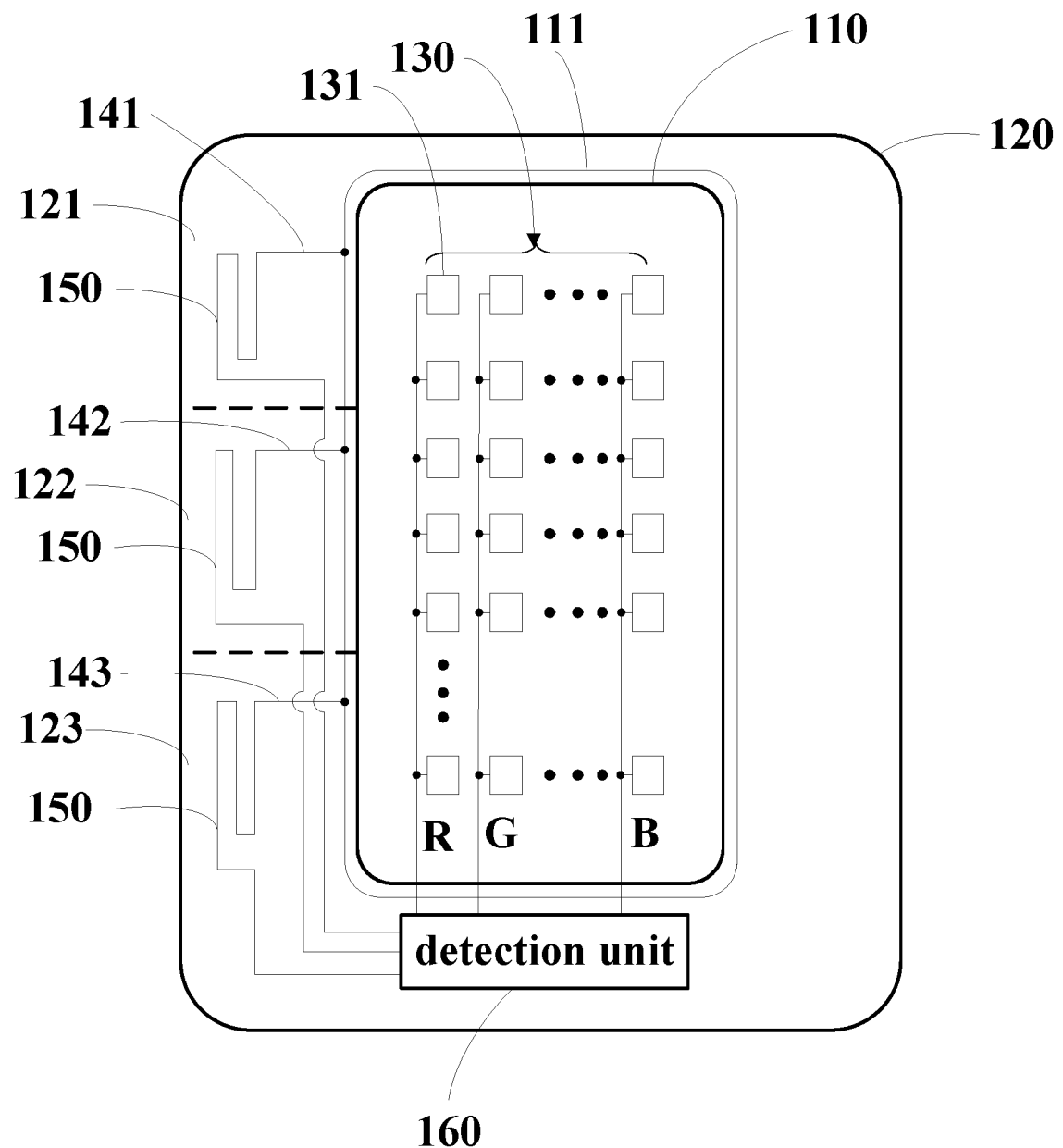
FIG. 1 is a circuit connection diagram showing a display device according to an embodiment of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It is also to be understood that the terms defined in for example general-purpose dictionaries should be construed as having meanings consistent with those in the context of the related art, rather than being construed in an idealized or extremely formalized sense unless explicitly thus defined here.

The techniques, methods, and devices known to a common technical person in the relevant art may not be discussed in detail, but where appropriate, the techniques, methods, and devices should be considered as part of the description.

The inventors of the present disclosure have found that operations such as bending a flexible screen are often performed in the process of manufacturing or carrying the flexible screen. For example, for some phones having a curved screen, a curved design is generally applied in a lateral side of the screen thereof. In the process of manufacturing or carrying the flexible screen, when the curvature radius of the flexible screen is too small to exceed the tolerance of the flexible screen, the flexible screen may be subjected to a fracture in an encapsulating material of the external layer, so that a crack may be present in the non-display area of the flexible screen, and the internal circuit may become open-circuit, which affects the display effect, and causes a decreased yield of the OLED flexible screen.

In view of this, the embodiments of the present disclosure provide a display device so that it is possible to detect whether a crack is present in the non-display area of the display device. The display device according to some embodiments of the present disclosure will be described in detail under in combination with the accompanying drawings.

FIG. 1 is a circuit connection diagram showing a display device according to an embodiment of the present disclosure. As shown in FIG. 1, the display device may comprise a display area 110 and a non-display area 120. The display device comprises: a pixel array 130, a plurality of switching transistors, and at least one detection line. For example, as shown in FIG. 1, the at least one detection line comprises a first detection line 141, a second detection line 142, and a third detection line 143.

As shown in FIG. 1, the pixel array 130 is at the display area 110. The pixel array 130 comprise a plurality of sub-pixels 131. Each sub-pixel is used to emit light having a corresponding color when the display device displays the image.

For example, as shown in FIG. 1, the display device may comprise a detection unit 160. The detection unit 160 may comprise the plurality of switching transistors (not shown in FIG. 1) as described above. The detection unit 160 is at the non-display area 120. Thus, the plurality of switching transistors are at the non-display area 120. The plurality of switching transistors are electrically connected to a plurality of columns of sub-pixels 131 of the pixel array 130 in one-to-one correspondence. That is, each of the plurality of switching transistors is electrically connected to a corresponding column of sub-pixels 131. The specific circuit structure with regard to the detection unit will be described in detail later in conjunction with FIGS. 2 and 3.

As shown in FIG. 1, the at least one detection line (for example, the first detection line 141, the second detection line 142, and the third detection line 143) is at the non-display area 120. Each of the at least one detection line is electrically connected to a part of the plurality of switching transistors. Each of the at least one detection line is configured to transmit a level signal to a switching transistor electrically connected to the each of the at least one detection line such that sub-pixels 131 of the pixel array 130 electrically connected to the switching transistor do not emit light. The sub-pixels 131 of the pixel array 130 electrically connected to the switching transistor (the switching transistor electrically connected to the each of the at least one detection line) emit light to display a bright line having a corresponding color in a case where the each of the at least one detection line is broken.

In the above embodiment, a display device is provided. The display device comprises a pixel array at a display area, a plurality of switching transistors at a non-display area, and at least one detection line at the non-display area. The plurality of switching transistors are electrically connected to a plurality of columns of sub-pixels of the pixel array in one-to-one correspondence. Each of the at least one detection line is configured to transmit a received level signal to a switching transistor electrically connected to the each of the at least one detection line such that sub-pixels of the pixel array electrically connected to the switching transistor do not emit light. The sub-pixels of the pixel array electrically connected to the switching transistor emit light to display a bright line having a corresponding color in a case where the each of the at least one detection line is broken. Since the at least one detection line is disposed at the non-display area, in a case where a crack is present in the non-display area, a detection line at the crack may be fractured. This will cause one or more columns of sub-pixels corresponding to the detection line to emit light, so that the one or more columns of sub-pixels display bright lines having corresponding colors. Therefore, by displaying bright lines having corresponding colors in the screen of the display area, it is possible to determine that a crack is present in the non-display area of the display device. This may effectively and accurately detect conditions such as the screen being excessively bent.

In some embodiments, the non-display area comprises at least one subarea. For example, as shown in FIG. 1, the at least one subarea may comprise a first subarea 121, a second subarea 122, and a third subarea 123.

In some embodiments, as shown in FIG. 1, each of the at least one detection line may comprise a curved portion 150. The curved portion 150 is at one of the at least one subarea. Each curved portion 150 is at a corresponding subarea. For example, a curved portion of the first detection line 141 is at the first subarea 121, a curved portion of the second detection line 142 is at the second subarea 122, and a curved portion of the third detection line 143 is at the third subarea 123.

By providing a curved portion in the detection line, the detection line may be more coiled at the non-display area, so that a crack in the non-display area is more easily detected. Each curved portion is disposed at a corresponding subarea such that the position of the crack may be determined when bright lines corresponding to different detection lines appear in the display area. For example, it is determined in which sub-region(s) the crack of the non-display area is located. This helps engineers to locate the excessively bent position more quickly and improve the bending preparation process in time, so that the yield of the flexible OLED display may be effectively improved.

For example, if one or more columns of sub-pixels corresponding to the first detection line emit light such that a bright line appears in the display area, it may be determined that the crack of the non-display area is located in the first subarea, thus determining the position of the crack.

It should be noted that, although FIG. 1 shows three subareas, the scope of the embodiments of the present disclosure is not limited to the number of subareas shown here. For example, the number of subareas may be more than three (e.g., four, five, six, etc.) or less than three (e.g., two, one, etc.).

In other embodiments, each of the at least one detection line may also comprise a non-curved portion in addition to a curved portion. For example, as shown in FIG. 1, a portion of the non-curved portion of the first detection line 141 is at the second subarea 122 and the third subarea 123, and a portion of the non-curved portion of the second detection line 142 is at the third subarea 123, and the like.

In some embodiments, as shown in FIG. 1, the display device may also comprise a power supply voltage line 111. The power supply voltage line 111 is at the non-display area 120. The power supply voltage line 111 may surround the display area 110. The power supply voltage line 111 is electrically connected to the at least one detection line. For example, the power supply voltage line is electrically connected to the first detection line 141, the second detection line 142, and the third detection line 143, respectively. The power supply voltage line 111 is configured to provide a level signal. The level signal is a power supply level signal VDD. For example, the power supply voltage line may provide the power supply level signal VDD to the detection line. The detection line may transmit the received power supply level signal VDD to the corresponding switching transistor such that the sub-pixels corresponding to the switching transistor do not emit light. In addition, the power supply voltage line may also provide the power supply level signal to the pixel array.

Figure 2:
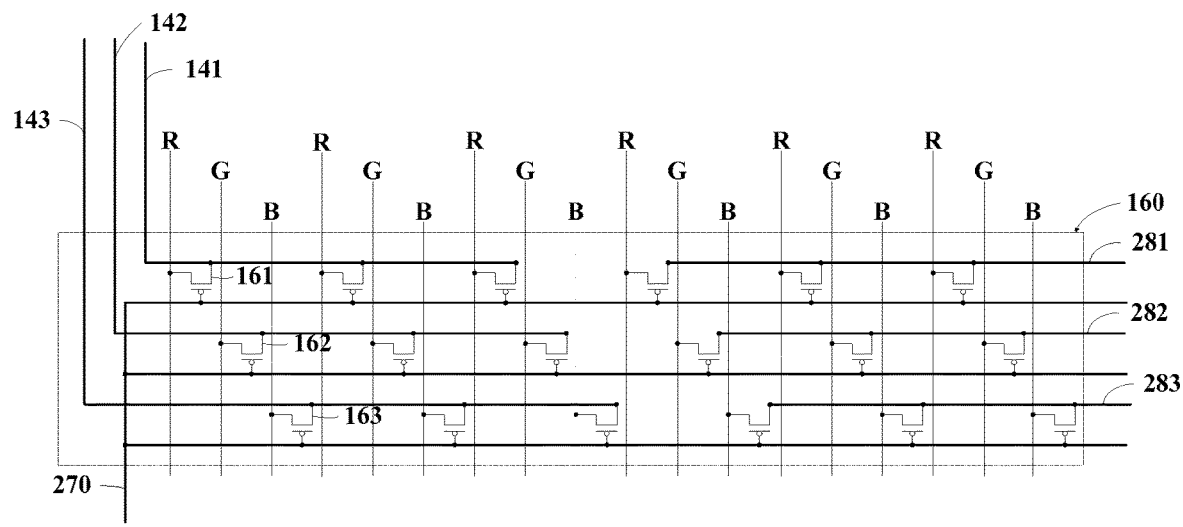
FIG. 2 is a schematic view showing a circuit connection of a detection line and a detection unit in a display device according to an embodiment of the present disclosure.

FIG. 2 is a schematic view showing a circuit connection of a detection line and a detection unit in a display device according to an embodiment of the present disclosure. In FIG. 2, R represents a red sub-pixel, G represents a green sub-pixel, and B represents a blue sub-pixel, similar to those in other drawings.

As shown in FIG. 2, the detection unit 160 may comprise a plurality of switching transistors. For example, the plurality of switching transistors may comprise a plurality of first switching transistors 161 corresponding to red sub-pixels R, a plurality of second switching transistors 162 corresponding to green sub-pixels G, and a plurality of third switching transistors 163 corresponding to blue sub-pixels B. For example, as shown in FIG. 2, in the plurality of switching transistors, the switching transistors in a first row are all the first switching transistors, the switching transistors in a second row are all the second switching transistors, and the switching transistors in the third row are all the third switching transistors. In some embodiments, the switching transistor may comprise an NMOS (N-channel Metal Oxide Semiconductor) transistor or a PMOS (P-channel Metal Oxide Semiconductor) transistor.

It should be noted that, the number of switching transistors shown in FIG. 2 is merely exemplary. Those skilled in the art will appreciate that, the detection unit may comprise more switching transistors, although not shown in the drawings.

As shown in FIG. 2, each of the plurality of switching transistors is electrically connected to sub-pixels in a corresponding column of the pixel array. For example, the first switching transistor 161 is electrically connected to the red sub-pixels R in a corresponding column of the pixel array, the second switching transistor 162 is electrically connected to the green sub-pixels G in a corresponding column of the pixel array, and the third switching transistor 163 is connected to the blue sub-pixels B in a corresponding column of the pixel array.

In some embodiments, as shown in FIG. 2, the at least one detection line comprises the first detection line 141, the second detection line 142, and the third detection line 143. The first detection line 141 is electrically connected to a part of the plurality of first switching transistors 161. For example, as shown in FIG. 2, the first detection line 141 is electrically connected to three first switching transistors 161. The second detection line 142 is electrically connected to a part of the plurality of second switching transistors 162. For example, as shown in FIG. 2, the second detection line 142 is electrically connected to three second switching transistors 162. The third detection line 143 is electrically connected to a part of the plurality of third switching transistors 163. For example, as shown in FIG. 2, the third detection line 143 is electrically connected to three third switching transistors 163.

As shown in FIG. 2, the first detection line 141 is electrically connected to a first electrode of the part (e.g., three first switching transistors 161) of the plurality of first switching transistors 161. A second electrode of the part of the plurality of first switching transistors 161 is electrically connected to red sub-pixels R (i.e., the red sub-pixels electrically connected to the part of the plurality of first switching transistors) in a corresponding column of the pixel array. A control electrode (e.g., a gate) of the part of the plurality of first switching transistors 161 is electrically connected to a switching signal line 270.

As shown in FIG. 2, the first electrode of each of another part of the plurality of first switching transistors 161 is electrically connected to a first driving line 281. The second electrode of each of the another part of the plurality of first switching transistors 161 is electrically connected to red sub-pixels R in a corresponding column of the pixel array.

The control electrode (e.g., the gate) of each of the another part of the plurality of first switching transistors 161 is electrically connected to the switching signal line 270.

Similarly, as shown in FIG. 2, the second detection line 142 is electrically connected to a first electrode of the part (e.g., three second switching transistors 162) of the plurality of second switching transistors 162. A second electrode of the part of the plurality of second switching transistors 162 is electrically connected to green sub-pixels G (i.e., the green sub-pixels electrically connected to the part of the plurality of second switching transistors) in a corresponding column of the pixel array. A control electrode (e.g., a gate) of the part of the plurality of second switching transistors 162 is electrically connected to the switching signal line 270.

As shown in FIG. 2, the first electrode of each of another part of the plurality of second switching transistors 162 is electrically connected to a second driving line 282. The second electrode of each of the another part of the plurality of second switching transistors 162 is electrically connected to green sub-pixels G in a corresponding column of the pixel array. The control electrode (e.g., the gate) of each of the another part of the plurality of second switching transistors 162 is electrically connected to the switching signal line 270.

Similarly, as shown in FIG. 2, the third detection line 143 is electrically connected to a first electrode of the part (e.g., three third switching transistors 163) of the plurality of third switching transistors 163. A second electrode of the part of the plurality of third switching transistors 163 is electrically connected to blue sub-pixels B (i.e., the blue sub-pixels electrically connected to the part of the plurality of third switching transistors) in a corresponding column of the pixel array. A control electrode (e.g., a gate) of the part of the plurality of third switching transistors 163 is electrically connected to the switching signal line 270.

As shown in FIG. 2, the first electrode of each of another part of the plurality of third switching transistors 163 is electrically connected to a third driving line 283. The second electrode of each of the another part of the plurality of third switching transistors 163 is electrically connected to blue sub-pixels B in a corresponding column of the pixel array. The control electrode (e.g., the gate) of each of the another part of the plurality of third switching transistors 163 is electrically connected to the switching signal line 270.

The process of detecting a crack in the non-display area according to some embodiments of the present disclosure will be described in detail below in conjunction with FIGS. 1 and 2.

In the embodiments of the present disclosure, in a case where the switching signal line 270 outputs an ON signal (for example, for a PMOS transistor, the ON signal is a low level signal; for an NMOS transistor, the ON signal is a high level signal), all of the switching transistors of the detection unit 160 are turned on. In a case where the first driving line 281, the second driving line 282, and the third driving line 283 respectively output corresponding data signals (as driving signals), the sub-pixels in the corresponding columns emit light respectively.

In a case where the detection line is not fractured, the detection line transmits the received power supply level signal to the corresponding switching transistor. The power supply level signal, as a data level, may be transmitted to sub-pixels in a corresponding column through the switching transistor. Since a gate-source voltage of a driving transistor within the sub-pixel is a difference between the data level and the power supply level signal which are applied to the driving transistor, the gate-source voltage at this time is almost 0V, so that the driving transistor does not output a driving current to a corresponding light emitting device, which results in that the light emitting device does not emit light. Therefore, in the case where the detection line is not fractured, the sub-pixels corresponding to each detection line does not emit light. Therefore, in a case where a crack is not present in the non-display area (correspondingly, the detection line is not fractured), a black line appears in a white screen.

It should be noted here that, in a case where it is detected that a crack is not present in the non-display area, when the display device is normally used to display a screen, the switching signal line 270 outputs an OFF signal (for example, for the PMOS transistor, the OFF signal is a high level signal; for the NMOS transistor, the OFF signal is a low level signal), and all of the switching transistors of the detection unit 160 are turned off. The data level may be transmitted to the pixel array by known other circuit paths to display a screen.

In a case where the detection line is fractured, the fractured detection line no longer transmits a power supply level signal to the corresponding switching transistor. Thus, a data level of about 0V may be regarded as being applied to the first electrode of the switching transistor, so that a column of sub-pixels corresponding to the switching transistor emit light.

For example, when a crack is present in the first subarea, the curved portion of the first detection line might be fractured, which causes the red sub-pixels corresponding to the first detection line to emit light, so that a red bright line appears in the display area. Thus, it is determined that a crack is present in the first subarea in a case where a red bright line appears in a white screen.

Similarly, it is determined that a crack is present in the second subarea in a case where a green bright line appears in a white screen. It is determined that a crack is present in the third subarea in a case where a blue bright line appears in a white screen.

In addition, in a case where the non-display area is present with multiple fractures or severely fractured (for example, multiple detection lines in the same subarea are damaged), a yellow bright line or a cyan bright line may appear in a white screen, or a white bright line may appear in a black screen.

For example, when a crack is present in each of the first subarea and the second subarea, the first detection line and the second detection line are fractured, so that the red sub-pixels corresponding to the first switching transistor and the green sub-pixels corresponding to the second switching transistor emit light, so that a yellow (i.e., a mixed color of red and green) bright line may appear in a white screen of the display area. Thus, it is determined that a crack is present in each of the first subarea and the second subarea in a case where a yellow bright line appears in a white screen.

In other embodiments, since a portion (e.g., the non-curved portion) of the first detection line and a portion of the second detection line are at an area (e.g., the second subarea or the third subarea, as shown in FIG. 1) of the non-display area, in a case where a crack is present in the area at which the first detection line and the second detection line are both located, a yellow bright line may also appear in the white screen. Therefore, it may be determined that a crack is present in the area (for example, a certain area within the second subarea) at which the first detection line and the second detection line are both located in a case where a yellow bright line appears in the white screen.

Similarly, it is determined that a crack is present in each of the second subarea and the third subarea or a crack is present in an area (for example a certain area within the third subarea) at which the second detection line and the third detection line are both located in a case where a cyan (a mixed color of green and blue) bright line appears in a white screen. It is determined that a crack is present in each of the first subarea and the third subarea or a crack is present in an area (for example a certain area within the third subarea) at which the first detection line and the third detection line are both located in a case where a magenta (a mixed color of red and blue) bright line appears in a white screen.

In some embodiments, the first driving line, the second driving line, and the third driving line respectively output a power supply level signal as a driving signal. This makes the corresponding sub-pixels not emit light, so that the display area displays a black screen. In a case where a crack is present in each of the first subarea, the second subarea, and the third subarea, the first detection line, the second detection line, and the third detection line are all fractured, so that the red sub-pixels, the green sub-pixels and the blue sub-pixels in the corresponding columns all emit light. Thus, a white bright line appears in a black screen. Therefore, it is determined that a crack is present in each of the first subarea, the second subarea and the third subarea in a case where a white bright line appears in a black screen. In other embodiments, it is determined that a crack is present in an area at which the first detection line, the second detection line and the third detection line are all located in a case where a white bright line appears in a black screen.

In the above embodiments, a position of the crack in the non-display area is determined according to a color of a bright line appearing in the display screen.

It should be noted that the above embodiments describe that the position of a crack is determined according to a color of the bright line in a white screen or a black screen. It will be understood by those skilled in the art that, the position of the crack may be determined according to a color of the bright line in the screen having another color. For example, it may be determined that a crack is present in the second subarea in a case where a green bright line appears in a red screen. Therefore, the scope of the embodiments of the present disclosure is not only limited thereto.

Figure 3:
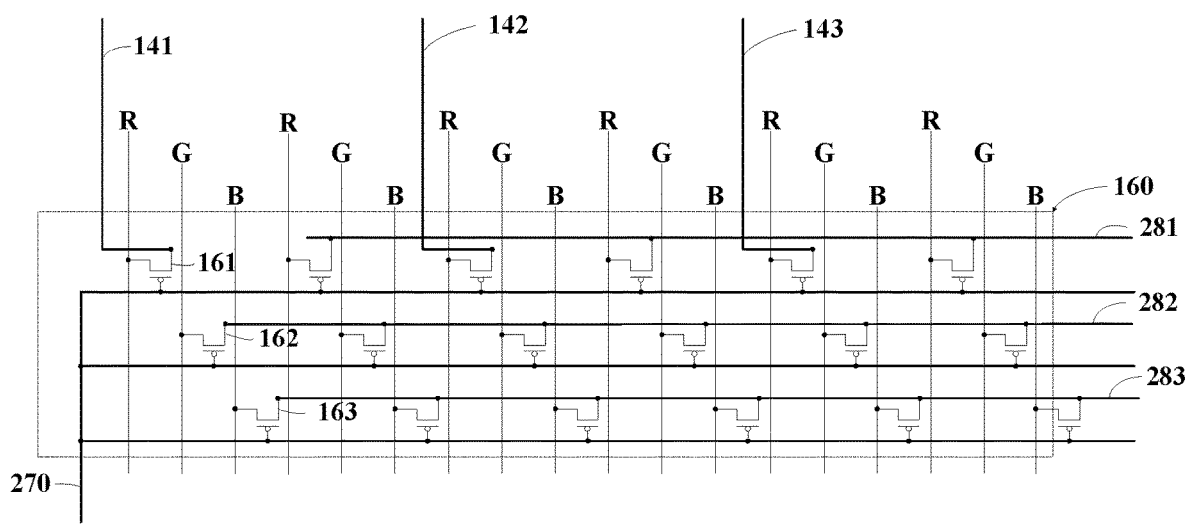
FIG. 3 is a schematic view showing a circuit connection of a detection line and a detection unit in a display device according to another embodiment of the present disclosure.

FIG. 3 is a schematic view showing a circuit connection of a detection line and a detection unit in a display device according to another embodiment of the present disclosure.

Similar to the detection unit shown in FIG. 2, the detection unit 160 shown in FIG. 3 comprises a plurality of switching transistors. For example, the plurality of switching transistors comprises a plurality of first switching transistors 161 corresponding to red sub-pixels R, a plurality of second switching transistors 162 corresponding to green sub-pixels and a plurality of third switching transistors 163 corresponding to blue sub-pixels B. For example, as shown in FIG. 3, in the plurality of switching transistors, the switching transistors in a first row are all first switching transistors 161, the switching transistors in a second row are all second switching transistors 162, and the switching transistors in a third row are all third switching transistors 163.

In some embodiments, as shown in FIG. 3, the at least one detection line may comprise a first detection line 141, a second detection line 142, and a third detection line 143. In addition, a switching signal line 270, a first driving line 281, a second driving line 282, and a third driving line 283 are also shown in FIG. 3.

In some embodiments, each of the at least one detection line is electrically connected to a part of the plurality of switching transistors. Sub-pixels corresponding to all of the switching transistors electrically connected to the at least one detection line have a same emission color.

In some embodiments, as shown in FIG. 3, the first detection line 141, the second detection line 142, and the third detection line 143 are electrically connected to different first switching transistors 161 respectively.

For example, as shown in FIG. 3, the first detection line 141 is electrically connected to a first electrode of one of the plurality of first switching transistors 161, the second detection line 142 is electrically connected to the first electrode of another of the plurality of first switching transistors 161, and the third detection line 143 is electrically connected to the first electrode of another of the plurality of first switching transistors 161. The first driving line 281 is electrically connected to the first electrode of each of the remaining first switching transistors 161. A second electrode of each of the plurality of first switching transistors 161 is electrically connected to red sub-pixels R in a corresponding column. The second driving line 282 is electrically connected to a first electrode of each of the plurality of second switching transistors 162. A second electrode of each of the plurality of second switching transistors 162 is electrically connected to green sub-pixels G in a corresponding column. The third driving line 283 is electrically connected to a first electrode of each of the plurality of third switching transistors 163. A second electrode of each of the plurality of third switching transistors 163 is electrically connected to blue sub-pixels B in a corresponding column. The switching signal line 270 is electrically connected to a control electrode (e.g., a gate) of each of all of the switching transistors.

The process of detecting a crack in the non-display area according to some embodiments of the present disclosure will be described in detail below in conjunction with FIGS. 1 and 3.

In a case where the switching signal line 270 outputs an ON signal, all of the switching transistors of the detection unit 160 are turned on. In a case where a crack is not present in the non-display area, the first detection line, the second detection line, and the third detection line respectively transmit the power supply level signal VDD to the corresponding switching transistor, such that the corresponding red sub-pixels do not emit light. Moreover, the first driving line, the second driving line, and the third driving line respectively transmit the data level (as a driving signal) to the corresponding switching transistors, so that the corresponding sub-pixels emit light. These light-emitting sub-pixels comprise green sub-pixels and blue sub-pixels adjacent to the red sub-pixels that do not emit light. Therefore, in a case where a cyan (a mixed color of green and blue) bright line appears in a white screen, it is determined that a crack is not present in the non-display area.

The first driving line 281, the second driving line 282, and the third driving line 283 respectively output power supply level signals as driving signals such that sub-pixels in the corresponding column do not emit light. In addition, the power supply voltage line 111 supplies the power supply level signal VDD to the first electrode of the corresponding first switching transistor through the first detection line 141, the second detection line 142, and the third detection line 143 respectively, which makes the red sub-pixels in the corresponding column do not emit light. Therefore, the display area displays a black screen.

In a case where a crack is present in the first subarea, the first detection line is fractured. Similar to the previous analysis, the fracture of the first detection line may cause the red sub-pixels in the corresponding column to emit light, so that a first red bright line corresponding to the first detection line appears in the black screen. Thus, it is determined that a crack is present in the first subarea in a case where the first red bright line corresponding to the first detection line appears in the black screen.

Similarly, it is determined that a crack is present in the second subarea in a case where a second red bright line corresponding to the second detection line appears in a black screen. It is determined that a crack is present in the third subarea in a case where a third red bright line corresponding to the third detection line appears in a black screen.

In addition, in a case where the non-display area is present with multiple fractures or severely fractured (for example, multiple detection lines in the same subarea are damaged), a plurality of bright lines may appear in a black screen.

For example, it is determined that a crack is present in each of the first subarea and the second subarea or a crack is present in an area at which the first detection line and the second detection line are both located in a case where the first red bright line and the second red bright line appear in a black screen.

For another example, it is determined that a crack is present in each of the first subarea and the third subarea or a crack is present in an area at which the first detection line and the third detection line are both located in a case where the first red bright line and the third red bright line appear in a black screen.

For another example, it is determined that a crack is present in each of the second subarea and the third subarea or a crack is present in an area at which the second detection line and the third detection line are both located in a case where the second red bright line and the third red bright line appear in a black screen.

For another example, it is determined that a crack is present in each of the first subarea, the second subarea and the third subarea or a crack is present in an area at which the first detection line, the second detection line and the third detection line are all located in a case where the first red bright line, the second red bright line and the third red bright line appear in a black screen.

In the above embodiments, the embodiments in which the first detection line, the second detection line, and the third detection line are electrically connected to at least one first switching transistor respectively are described. However, the scope of the embodiments of the present disclosure is not limited thereto.

In other embodiments, the first detection line, the second detection line, and the third detection line are electrically connected to different second switching transistors respectively. In such case, a position of the crack may be detected by the following method:

(1) It is determined that a crack is present in the first subarea in a case where a first green bright line corresponding to the first detection line appears in a black screen.

(2) It is determined that a crack is present in the second subarea in a case where a second green bright line corresponding to the second detection line appears in a black screen.

(3) It is determined that a crack is present in the third subarea in a case where a third green bright line corresponding to the third detection line appears in a black screen.

(4) It is determined that a crack is present in each of the first subarea and the second subarea or a crack is present in an area at which the first detection line and the second detection line are both located in a case where the first green bright line and the second green bright line appear in a black screen.

(5) It is determined that a crack is present in each of the first subarea and the third subarea or a crack is present in an area at which the first detection line and the third detection line are both located in a case where the first green bright line and the third green bright line appear in a black screen.

(6) It is determined that a crack is present in each of the second subarea and the third subarea or a crack is present in an area at which the second detection line and the third detection line are both located in a case where the second green bright line and the third green bright line appear in a black screen.

(7) It is determined that a crack is present in each of the first subarea, the second subarea and the third subarea or a crack is present in an area at which the first detection line, the second detection line and the third detection line are all located in a case where the first green bright line, the second green bright line and the third green bright line appear in a black screen.

In other embodiments, the first detection line, the second detection line, and the third detection line are electrically connected to different third switching transistors respectively. In such case, a position of the crack may be detected by the following method:

(1) It is determined that a crack is present in the first subarea in a case where a first blue bright line corresponding to the first detection line appears in a black screen.

(2) It is determined that a crack is present in the second subarea in a case where a second blue bright line corresponding to the second detection line appears in a black screen.

(3) It is determined that a crack is present in the third subarea in a case where a third blue bright line corresponding to the third detection line appears in a black screen.

(4) It is determined that a crack is present in each of the first subarea and the second subarea or a crack is present in an area at which the first detection line and the second detection line are both located in a case where the first blue bright line and the second blue bright line appear in a black screen.

(5) It is determined that a crack is present in each of the first subarea and the third subarea or a crack is present in an area at which the first detection line and the third detection line are both located in a case where the first blue bright line and the third blue bright line appear in a black screen.

(6) It is determined that a crack is present in each of the second subarea and the third subarea or a crack is present in an area at which the second detection line and the third detection line are both located in a case where the second blue bright line and the third blue bright line appear in a black screen.

(7) It is determined that a crack is present in each of the first subarea, the second subarea and the third subarea or a crack is present in an area at which the first detection line, the second detection line and the third detection line are all located in a case where the first blue bright line, the second blue bright line and the third blue bright line appear in a black screen.

In the above embodiments, a position of the crack in the non-display area is determined according to a position of a bright line appearing in the display screen.

In some embodiments, a part of the at least one detection line is on one side of the display area, and another part of the at least one detection line is on another side of the display area opposite to the one side. Such embodiments will be described in detail below in conjunction with FIG. 4.

Figure 4:
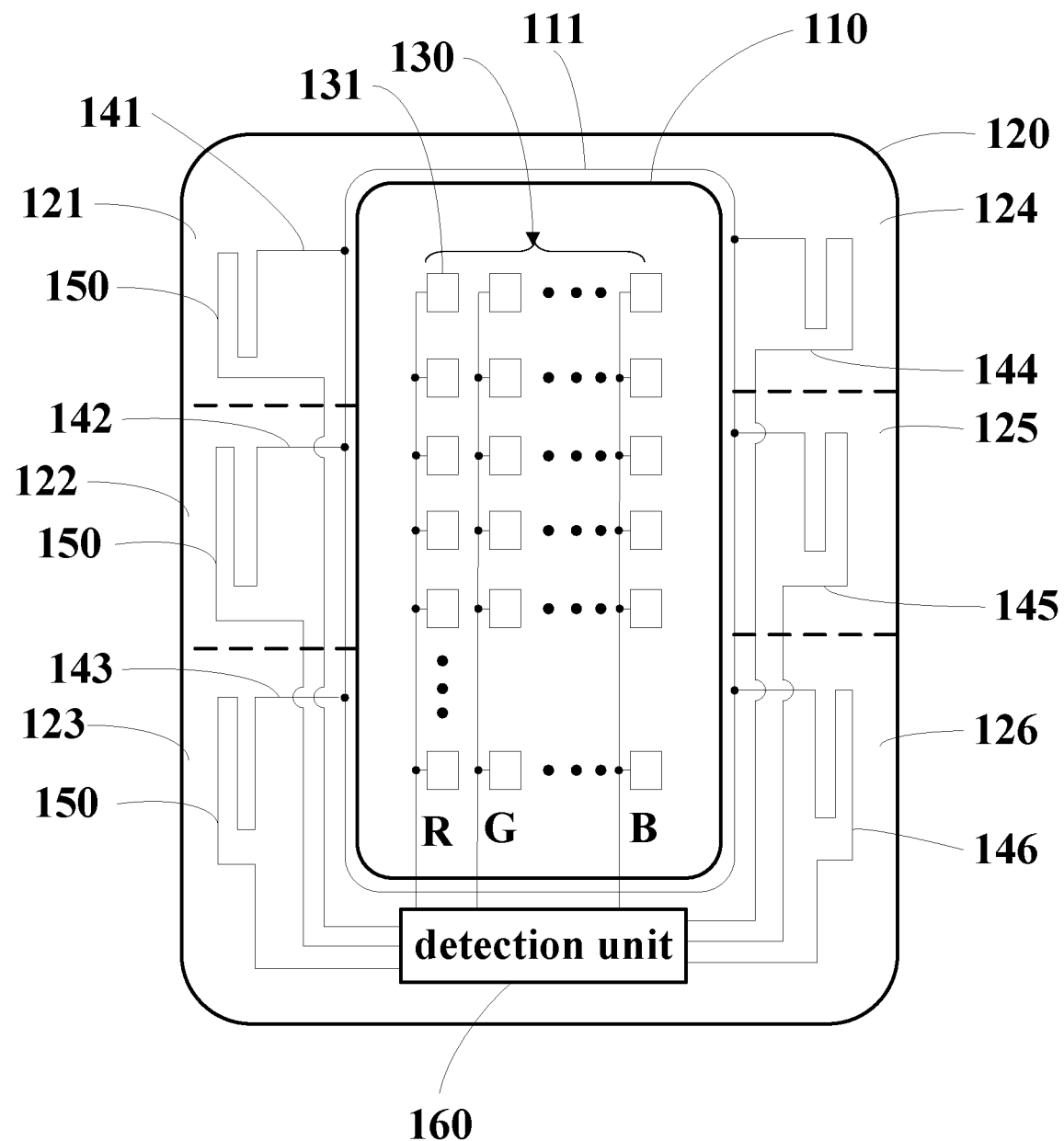
FIG. 4 is a circuit connection diagram showing a display device according to another embodiment of the present disclosure.

FIG. 4 is a circuit connection diagram showing a display device according to another embodiment of the present disclosure.

For example, as shown in FIG. 4, the at least one detection line may comprise a first detection line 141, a second detection line 142, a third detection line 143, a fourth detection line 144, a fifth detection line 145, and a sixth detection line 146. The at least one subarea may comprise a first subarea 121, a second subarea 122, a third subarea 123, a fourth subarea 124, a fifth subarea 125, and a sixth subarea 126. The curved portion of the first detection line 141 is at the first subarea 121. The curved portion of the second detection line 142 is at the second subarea 122. The curved portion of the third detection line 143 is at the third subarea 123. The curved portion of the fourth detection line 144 is at the fourth subarea 124. The curved portion of the fifth detection line 145 is at the fifth subarea 125. The curved portion of the sixth detection line 146 is at the sixth subarea 126.

The first subarea 121, the second subarea 122, and the third subarea 123 are on one side (for example, a left side) of the display area 110. The fourth subarea 124, the fifth subarea 125, and the sixth subarea 126 are on another side (e.g., a right side) of the display area opposite to the one side. Therefore, the first detection line 141, the second detection line 142, and the third detection line 143 are on the one side (for example, the left side) of the display area 110, and the fourth detection line 144, the fifth detection line 145, and the sixth detection line 146 are the another side (e.g., the right side) of the display area opposite to the one side.

The fourth detection line 144, the fifth detection line 145, and the sixth detection line 146 may be electrically connected to a part of the switching transistors of the detection unit 160 in a connection manner similar to that of the first detection line 141, the second detection line 142, and the third detection line 143 in FIG. 2 or FIG. 3. Thus, whether a crack is present in the fourth subarea 124, the fifth subarea 125, or the sixth subarea 126 may be determined using the fourth detection line 144, the fifth detection line 145, or the sixth detection line 146 respectively by a method of detecting a crack similar to that described above. The detection process here may be understood by those skilled in the art according to the foregoing description, and thus will not be repeated here.

In some embodiments, the at least one detection line may be symmetrically arranged on both sides of the display area. For example, as shown in FIG. 4, the first detection line 141, the second detection line 142, the third detection line 143, the fourth detection line 144, the fifth detection line 145, and the sixth detection line 146 are symmetrically arranged on both sides of the display area 110, respectively. This facilitates detecting a position of the crack.

It should be noted that the symmetric arrangement here may mean that the number of the detection lines on both sides of the display area is symmetrical, or that the coiled shape of the detection lines on both sides of the display area is symmetrical.

In some embodiments, the at least one detection line may be asymmetrically arranged on both sides of the display area. For example, three detection lines are arranged on one side of the display area, and two detection lines are arranged on another side of the display area, and the like.

It should be noted that, the number of the detection lines in the embodiments of the present disclosure is merely exemplary. Those skilled in the art may understand that the number of the detection lines may be set according to actual needs. Therefore, the scope of the embodiments of the present disclosure is not only limited to the numbers of the detection lines disclosed here.

Figure 5:
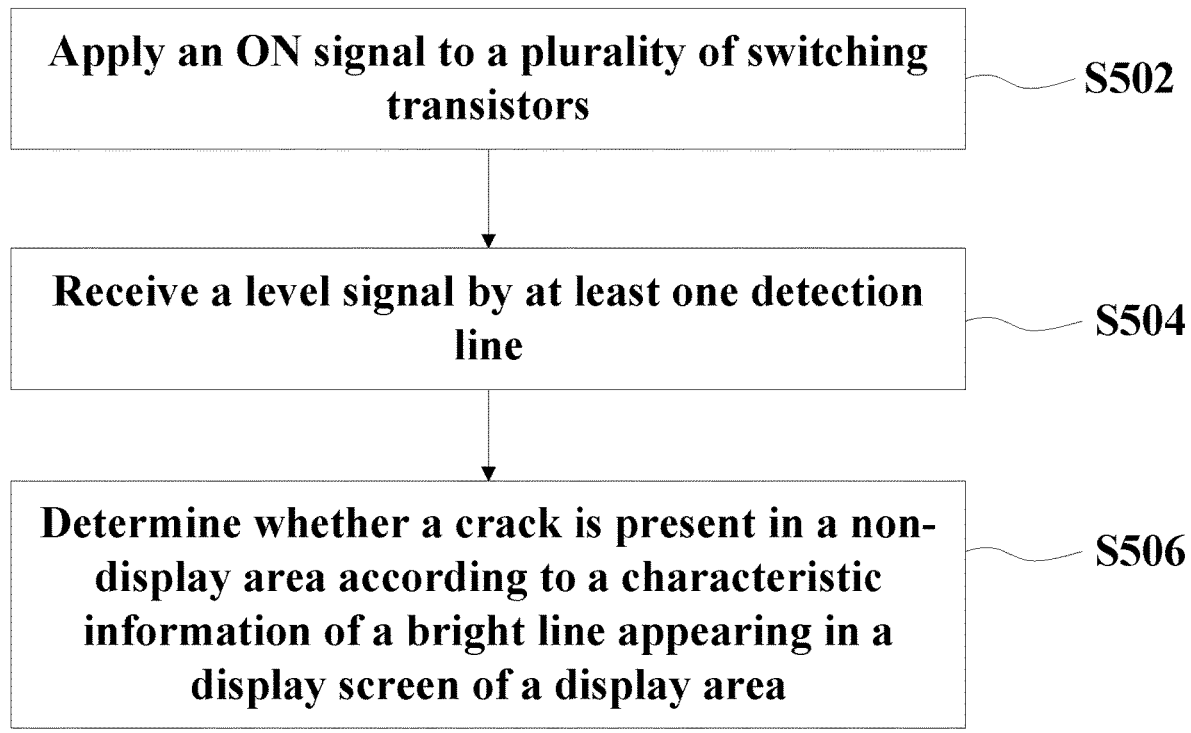
FIG. 5 is a flow chart showing a detection method for a display device according to an embodiment of the present disclosure.

FIG. 5 is a flow chart showing a detection method for a display device according to an embodiment of the present disclosure. For example, the display device may comprise a pixel array, a plurality of switching transistors, and at least one detection line as described above. For example, the display device may be a display device shown in FIG. 1 or FIG. 4. As shown in FIG. 5, the detection method comprises steps S502 to S506.

At step S502, an ON signal is applied to the plurality of switching transistors. This makes the plurality of switching transistors be all turned on.

At step S504, a level signal is received by the at least one detection line. For example, the level signal is a power supply level signal.

Each of the at least one detection line transmits the level signal to a corresponding switching transistor. In a case where the detection line is not fractured, the detection line transmits the level signal to the corresponding switching transistor such that the sub-pixels in the corresponding column do not emit light. In a case where a certain detection line is fractured, the detection line does not transmit the level signal to the corresponding switching transistor such that the sub-pixels in the corresponding column emit light, so that a bright line having a corresponding color appears in the display screen of the display area.

At step S506, it is determined whether a crack is present in a non-display area according to a characteristic information of a bright line appearing in a display screen of a display area. For example, the characteristic information comprises a color or a position of the bright line.

In the detection method of the above embodiment, it is determined whether a crack is present in the non-display area of the display device according to a characteristic information of a bright line appearing in a display screen of a display area. This may effectively and accurately detect conditions such as the screen being excessively bent.

In some embodiments, the non-display area may comprise a first subarea, a second subarea, and a third subarea. A curved portion of the first detection line is at the first subarea, a curved portion of the second detection line is at the second subarea, and a curved portion of the third detection line is at the third subarea.

In some embodiments, the detection method further comprises: determining a position of the crack in the non-display area according to a color of the bright line appearing in the display screen. For example, it may be determined in which subarea(s) the crack is located according to a color of the bright line.

In some embodiments, the step of determining a position of the crack according to a color of the bright line may comprise at least one of the following steps:

(1) It is determined that a crack is present in the first subarea in a case where a red bright line appears in a white screen.

(2) It is determined that a crack is present in the second subarea in a case where a green bright line appears in a white screen.

(3) It is determined that a crack is present in the third subarea in a case where a blue bright line appears in a white screen.

(4) It is determined that a crack is present in each of the first subarea and the second subarea or a crack is present in an area at which the first detection line and the second detection line are both located in a case where a yellow bright line appears in a white screen.

(5) It is determined that a crack is present in each of the second subarea and the third subarea or a crack is present in an area at which the second detection line and the third detection line are both located in a case where a cyan bright line appears in a white screen.

(6) It is determined that a crack is present in each of the first subarea and the third subarea or a crack is present in an area at which the first detection line and the third detection line are both located in a case where a magenta bright line appears in a white screen.

(7) It is determined that a crack is present in each of the first subarea, the second subarea and the third subarea or a crack is present in an area at which the first detection line, the second detection line and the third detection line are all located in a case where a white bright line appears in a black screen.

In the above embodiment, according to the above various implementation manners, the purpose of determining a position of the crack in the non-display area according to a color of the bright line can be achieved. Moreover, when one of the implementation manners (4) to (7) described above occurs, it is indicated that the non-display area is relatively severely fractured.

In other embodiments, the detection method further comprises: determining a position of the crack in the non-display area according to a position of the bright line appearing in the display screen. For example, it may be determined in which subarea(s) a crack is located according to a position of the bright line.

In some embodiments, the step of determining a position of the crack according to a position of the bright line may comprise at least one of the following steps:

(1) It is determined that a crack is present in the first subarea in a case where a first red, green or blue bright line corresponding to the first detection line appears in a black screen.

(2) It is determined that a crack is present in the second subarea in a case where a second red, green or blue bright line corresponding to the second detection line appears in a black screen.

(3) It is determined that a crack is present in the third subarea in a case where a third red, green or blue bright line corresponding to the third detection line appears in a black screen.

(4) It is determined that a crack is present in each of the first subarea and the second subarea or a crack is present in an area at which the first detection line and the second detection line are both located in a case where the first red, green or blue bright line and the second red, green or blue bright line appear in a black screen.

(5) It is determined that a crack is present in each of the first subarea and the third subarea or a crack is present in an area at which the first detection line and the third detection line are both located in a case where the first red, green or blue bright line and the third red, green or blue bright line appear in a black screen.

(6) It is determined that a crack is present in each of the second subarea and the third subarea or a crack is present in an area at which the second detection line and the third detection line are both located in a case where the second red, green or blue bright line and the third red, green or blue bright line appear in a black screen.

(7) It is determined that a crack is present in each of the first subarea, the second subarea and the third subarea or a crack is present in an area at which the first detection line, the second detection line and the third detection line are all located in a case where the first red, green or blue bright line, the second red, green or blue bright line and the third red, green or blue bright line appear in a black screen.

In the above embodiment, according to the above various implementation manners, the purpose of determining a position of the crack according to a position of the bright line can be achieved. Moreover, when one of the implementation manners (4) to (7) described above occurs, it is indicated that the non-display area is relatively severely fractured.

The detection method of the embodiments of the present disclosure may realize the crack detection and crack positioning of the flexible screen, so that the yield of the flexible screen may be effectively improved.

The detection method may timely detect a crack, a crack position and a fracture degree in the Cell Test stage, so that engineers adjust the bending device in time and standardize the bending operation. This can effectively improve the product yield. The detection method has no influence on the resolution, display color, and product frame substrate of the flexible screen. Moreover, the detection method makes minor modifications to the original manufacturing process of the OLED, and basically has no influence on the characteristics of the light-emitting layer.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the disclosure is defined by the following claims.

What is claimed is:

1. A display device, having a display area and a non-display area, wherein the display device comprises:
  a pixel array disposed in the display area that comprises a plurality of sub-pixels;
  a plurality of switching transistors disposed in the non-display area, which are electrically connected to a plurality of columns of sub-pixels of the pixel array in one-to-one correspondence;
  a plurality of detection lines disposed in the non-display area, wherein each of the plurality of detection lines is electrically connected to a part of the plurality of switching transistors, and is configured to transmit a level signal to a switching transistor electrically connected to the each of the plurality of detection lines such that sub-pixels of the pixel array electrically connected to the switching transistor do not emit light in a case where the each of the plurality of detection lines is not broken, and wherein the sub-pixels of the pixel array electrically connected to the switching transistor emit light to display a bright line having a corresponding color in a case where the each of the plurality of detection lines is broken, each of the plurality of detection lines is electrically connected to a part of the plurality of switching transistors, wherein sub-pixels corresponding to all of the switching transistors electrically connected to the plurality of detection lines have a same emission color, and a position of a crack in the non-display area is determined according to a position of the bright line appearing in a display screen; and a plurality of driving lines electrically connected to first electrodes of other switching transistors except for the part of the plurality of switching transistors electrically connected to the plurality of detection lines.

2. The display device according to claim 1, wherein
the non-display area comprises a plurality of subareas;
each of the plurality of subareas comprises a curved portion at one of the plurality of subareas.

3. The display device according to claim 2, wherein
the plurality of switching transistors comprises a plurality of first switching transistors corresponding to red sub-pixels, a plurality of second switching transistors corresponding to green sub-pixels, and a plurality of third switching transistors corresponding to blue sub-pixels;
the plurality of detection lines comprises a first detection line, a second detection line, and a third detection line, wherein
the first detection line, the second detection line, and the third detection line are electrically connected to different first switching transistors respectively;
the first detection line, the second detection line, and the third detection line are electrically connected to different second switching transistors respectively; or
the first detection line, the second detection line, and the third detection line are electrically connected to different third switching transistors respectively.

4. The display device according to claim 3, wherein
the plurality of subareas comprises a first subarea, a second subarea, and a third subarea;
a curved portion of the first detection line is at the first subarea, a curved portion of the second detection line is at the second subarea, and a curved portion of the third detection line is at the third subarea.

5. The display device according to claim 1, further comprising:
a power supply voltage line at the non-display area, wherein the power supply voltage line is electrically connected to the plurality of detection lines, and configured to provide the level signal which is a power supply level signal.

6. The display device according to claim 1, wherein
a part of the plurality of detection lines is on one side of the display area, and another part of the plurality of detection lines is on another side of the display area opposite to the one side.

7. A detection method for a display device, the display device having a display area and a non-display area, wherein the display device comprises: a pixel array disposed in the display area that comprises a plurality of sub-pixels; a plurality of switching transistors disposed in the non-display area, which are electrically connected to a plurality of columns of sub-pixels of the pixel array in one-to-one correspondence; a plurality of detection lines disposed in the non-display area, wherein each of the plurality of detection lines is electrically connected to a part of the plurality of switching transistors, and is configured to transmit a level signal to a switching transistor electrically connected to the each of the plurality of detection lines such that sub-pixels of the pixel array electrically connected to the switching transistor do not emit light in a case where the each of the plurality of detection lines is not broken, and wherein the sub-pixels of the pixel array electrically connected to the switching transistor emit light to display a bright line having a corresponding color in a case where the each of the plurality of detection lines is broken, each of the plurality of detection lines is electrically connected to a part of the plurality of switching transistors, wherein sub-pixels corresponding to all of the switching transistors electrically connected to the plurality of detection lines have a same emission color; and a plurality of driving lines electrically connected to first electrodes of other switching transistors except for the part of the plurality of switching transistors electrically connected to the plurality of detection lines;

the detection method comprising:
applying an ON signal to the plurality of switching transistors;
receiving the level signal by the plurality of detection lines;
determining whether a crack is present in the non-display area according to a characteristic information of the bright line appearing in a display screen of the display area; and
determining a position of the crack in the non-display area according to a position of the bright line appearing in the display screen.

8. The detection method according to claim 7, wherein the plurality of switching transistors comprises: a plurality of first switching transistors corresponding to red sub-pixels, a plurality of second switching transistors corresponding to green sub-pixels, and a plurality of third switching transistors corresponding to blue sub-pixels; the plurality of detection lines comprises: a first detection line, a second detection line, and a third detection line, wherein the first detection line, the second detection line, and the third detection line are electrically connected to different first switching transistors respectively; each of the plurality of detection lines comprises a curved portion; and the non-display area comprises a first subarea, a second subarea, and a third subarea, wherein a curved portion of the first detection line is at the first subarea, a curved portion of the second detection line is at the second subarea, and a curved portion of the third detection line is at the third subarea;

wherein the step of determining a position of the crack according to a position of the bright line comprises:
determining that a crack is present in the first subarea in a case where a first red bright line corresponding to the first detection line appears in a black screen;
determining that a crack is present in the second subarea in a case where a second red bright line corresponding to the second detection line appears in the black screen;
determining that a crack is present in the third subarea in a case where a third red bright line corresponding to the third detection line appears in the black screen;
determining that a crack is present in each of the first subarea and the second subarea or a crack is present in an area at which the first detection line and the second detection line are both located in a case where the first red bright line and the second red bright line appear in the black screen;
determining that a crack is present in each of the first subarea and the third subarea or a crack is present in an area at which the first detection line and the third detection line are both located in a case where the first red bright line and the third red bright line appear in the black screen;
determining that a crack is present in each of the second subarea and the third subarea or a crack is present in an area at which the second detection line and the third detection line are both located in a case where the second red bright line and the third red bright line appear in the black screen; and determining that a crack is present in each of the first subarea, the second subarea and the third subarea or a crack is present in an area at which the first detection line, the second detection line and the third detection line are all located in a case where the first red bright line, the second red bright line and the third red bright line appear in the black screen.

9. The detection method according to claim 7, wherein the plurality of switching transistors comprises: a plurality of first switching transistors corresponding to red sub-pixels, a plurality of second switching transistors corresponding to green sub-pixels, and a plurality of third switching transistors corresponding to blue sub-pixels; the plurality of detection lines comprises: a first detection line, a second detection line, and a third detection line, wherein the first detection line, the second detection line, and the third detection line are electrically connected to different second switching transistors respectively; each of the plurality of detection lines comprises a curved portion; and the non-display area comprises a first subarea, a second subarea, and a third subarea, wherein a curved portion of the first detection line is at the first subarea, a curved portion of the second detection line is at the second subarea, and a curved portion of the third detection line is at the third subarea;

wherein the step of determining a position of the crack according to a position of the bright line comprises:

determining that a crack is present in the first subarea in a case where a first green bright line corresponding to the first detection line appears in a black screen;

determining that a crack is present in the second subarea in a case where a second green bright line corresponding to the second detection line appears in the black screen;

determining that a crack is present in the third subarea in a case where a third green bright line corresponding to the third detection line appears in the black screen;

determining that a crack is present in each of the first subarea and the second subarea or a crack is present in an area at which the first detection line and the second detection line are both located in a case where the first green bright line and the second green bright line appear in the black screen;

determining that a crack is present in each of the first subarea and the third subarea or a crack is present in an area at which the first detection line and the third detection line are both located in a case where the first green bright line and the third green bright line appear in the black screen;

determining that a crack is present in each of the second subarea and the third subarea or a crack is present in an area at which the second detection line and the third detection line are both located in a case where the second green bright line and the third green bright line appear in the black screen; and determining that a crack is present in each of the first subarea, the second subarea and the third subarea or a crack is present in an area at which the first detection line, the second detection line and the third detection line are all located in a case where the first green bright line, the second green bright line and the third green bright line appear in the black screen.

10. The detection method according to claim 7, wherein the plurality of switching transistors comprises: a plurality of first switching transistors corresponding to red sub-pixels, a plurality of second switching transistors corresponding to green sub-pixels, and a plurality of third switching transistors corresponding to blue sub-pixels; the plurality of detection lines comprises: a first detection line, a second detection line, and a third detection line, wherein the first detection line, the second detection line, and the third detection line are electrically connected to different third switching transistors respectively; each of the plurality of detection lines comprises a curved portion; and the non-display area comprises a first subarea, a second subarea, and a third subarea, wherein a curved portion of the first detection line is at the first subarea, a curved portion of the second detection line is at the second subarea, and a curved portion of the third detection line is at the third subarea;

wherein the step of determining a position of the crack according to a position of the bright line comprises:

determining that a crack is present in the first subarea in a case where a first blue bright line corresponding to the first detection line appears in a black screen;

determining that a crack is present in the second subarea in a case where a second blue bright line corresponding to the second detection line appears in the black screen;

determining that a crack is present in the third subarea in a case where a third blue bright line corresponding to the third detection line appears in the black screen;

determining that a crack is present in each of the first subarea and the second subarea or a crack is present in an area at which the first detection line and the second detection line are both located in a case where the first blue bright line and the second blue bright line appear in the black screen;

determining that a crack is present in each of the first subarea and the third subarea or a crack is present in an area at which the first detection line and the third detection line are both located in a case where the first blue bright line and the third blue bright line appear in the black screen;

determining that a crack is present in each of the second subarea and the third subarea or a crack is present in an area at which the second detection line and the third detection line are both located in a case where the second blue bright line and the third blue bright line appear in the black screen; and determining that a crack is present in each of the first subarea, the second subarea and the third subarea or a crack is present in an area at which the first detection line, the second detection line and the third detection line are all located in a case where the first blue bright line, the second blue bright line and the third blue bright line appear in the black screen.

* * * * *